US010403748B2

United States Patent
Chun

(10) Patent No.: US 10,403,748 B2
(45) Date of Patent: Sep. 3, 2019

(54) SEMICONDUCTOR DEVICE INCLUDING SILICON CARBIDE

(71) Applicants: Hyundai Motor Company, Seoul (KR); Kia Motors Corporation, Seoul (KR)

(72) Inventor: Dae Hwan Chun, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 27 days.

(21) Appl. No.: 15/828,898

(22) Filed: Dec. 1, 2017

(65) Prior Publication Data

US 2019/0123191 A1 Apr. 25, 2019

(30) Foreign Application Priority Data

Oct. 25, 2017 (KR) .......................... 10-2017-0139144

(51) Int. Cl.
*H01L 29/06* (2006.01)
*H01L 29/10* (2006.01)
(Continued)

(52) U.S. Cl.
CPC ...... *H01L 29/7813* (2013.01); *H01L 29/0696* (2013.01); *H01L 29/0865* (2013.01);
(Continued)

(58) Field of Classification Search
CPC ............. H01L 29/7813; H01L 29/0865; H01L 29/1095; H01L 29/0882; H01L 29/0696; H01L 29/1608; H01L 29/4236
See application file for complete search history.

(56) References Cited

U.S. PATENT DOCUMENTS 5,136,349 A * 8/1992 Yilmaz ............... H01L 29/0626
 257/133
6,236,099 B1 * 5/2001 Boden, Jr. ........... H01L 29/0619
 257/495

(Continued)

FOREIGN PATENT DOCUMENTS

JP 2001-352063 A 12/2001
KR 10-0741031 B1 7/2007

OTHER PUBLICATIONS

Chien, et al., "A Novel High Channel Density Trench Power MOSFETs Design by Asymmetric Wing-cell Structure," Power Electronics and Applications, (2007), European Conference on Date of Conference: Sep. 2-5, 2007, IEEE.

*Primary Examiner* — Steven H Loke
*Assistant Examiner* — Juanita B Rhodes
(74) *Attorney, Agent, or Firm* — Mintz Levin Cohn Ferris Glovsky and Popeo, P.C.; Peter F. Corless

(57) ABSTRACT

A semiconductor device includes: an n+ type of silicon carbide substrate, an n− type of layer, first trenches, a p type of region, a p+ type of region, an n+ type of region, a gate electrode, a source electrode, and a drain electrode. The semiconductor device may include a plurality of unit cells, wherein one of the plurality of unit cells may include a contact portion at which the source electrode and the p+ type of region contact each other, an outer portion disposed at upper and lower portions of the contact portion in a plan view, and a connection portion connecting the contact portion to the outer portion, a width between the first trenches horizontally adjacent in the plan view in the contact portion is equal to a width between the first trenches horizontally adjacent in the plan view in the outer portion, and a width between the first trenches horizontally adjacent in the plan view in the connection portion is less than a width between (Continued)

the first trenches horizontally adjacent in the plan view in the contact portion.

13 Claims, 6 Drawing Sheets

(51) Int. Cl.
    *H01L 29/16*     (2006.01)
    *H01L 29/78*     (2006.01)
    *H01L 29/423*     (2006.01)
    *H01L 29/08*     (2006.01)

(52) U.S. Cl.
    CPC ...... *H01L 29/0882* (2013.01); *H01L 29/1095* (2013.01); *H01L 29/1608* (2013.01); *H01L 29/4236* (2013.01)

(56) References Cited

U.S. PATENT DOCUMENTS

| | | | |
|---|---|---|---|
| 2007/0040213 A1* | 2/2007 | Hotta | H01L 29/0696 257/330 |
| 2017/0012108 A1* | 1/2017 | Sakakibara | H01L 21/2033 |

* cited by examiner

SEMICONDUCTOR DEVICE INCLUDING SILICON CARBIDE

CROSS-REFERENCE TO RELATED APPLICATION

This application claims the benefit of priority to Korean Patent Application No. 10-2017-0139144 filed in the Korean Intellectual Property Office on Oct. 25, 2017, the entire contents of which are incorporated by reference as if fully set forth herein.

BACKGROUND

(a) Technical Field

The present disclosure relates generally to semiconductor devices and, more particularly, to a semiconductor device including silicon carbide (SiC).

(b) Description of the Related Art

A power semiconductor device requires a low on-resistance or a low saturated voltage to reduce power loss in a conduction-state while allowing a large current to flow. In addition, a power semiconductor device must be able to endure a backward high voltage (i.e., "high breakdown voltage") of a PN junction which is applied to opposite ends of the power semiconductor device in an off-state or at the moment when the switch is turned off. An example power semiconductor device is the metal oxide semiconductor field effect transistor (MOSFET), which is most commonly used as a field effect transistor (FET) in a digital circuit and an analog circuit.

When manufacturing a power semiconductor device, a concentration and thickness of the epitaxial layer or drift region of a row material are determined according to a rated voltage required by a power system. According to Poisson's equation, because a high breakdown voltage for a power semiconductor device is required, an epitaxial layer or drift region of low concentration and relatively high thickness are needed. However, they often cause an increase in resistance and reduce a forward direction current density.

Accordingly, research has been conducted for increasing the forward direction current density without affecting the concentration and the thickness of the epitaxial layer or the drift region of the power semiconductor device.

The above information disclosed in this Background section is only for enhancement of understanding of the background of the disclosure, and therefore it may contain information that does not form the related art.

SUMMARY

The present disclosure has been made in an effort to provide a silicon carbide semiconductor device that may increase a forward direction current density.

According to embodiments of the present disclosure, a semiconductor device includes: an n+ type of silicon carbide substrate, an n− type of layer, first trenches, a p type of region, a p+ type of region, an n+ type of region, a gate electrode, a source electrode, and a drain electrode. The semiconductor device may include a plurality of unit cells, wherein one of the plurality of unit cells may include a contact portion at which the source electrode and the p+ type of region contact each other, an outer portion disposed at upper and lower portions of the contact portion in a plan view, and a connection portion connecting the contact portion to the outer portion, a width between the first trenches horizontally adjacent in the plan view in the contact portion is equal to a width between the first trenches horizontally adjacent in the plan view in the outer portion, and a width between the first trenches horizontally adjacent in the plan view in the connection portion is less than a width between the first trenches horizontally adjacent in the plan view in the contact portion.

The first trenches may have a lattice shape in the plan view.

The semiconductor device may further include second trenches that are spaced apart from the first trenches.

The trenches may have a matrix shape in the plan view.

Each unit cell of the plurality of unit cells may include a second trench of the second trenches, and the second trench may be disposed at a central portion of each unit cell.

The second trench may be disposed at the contact portion, and the p+ type of region may be disposed below a lower surface of the second trench.

The n− type of layer may be disposed on a first surface of the n+ type of silicon carbide substrate, the p type of region may be disposed on the n− type of layer, and the n+ type of region may be disposed on the p type of region.

A first trench of the first trenches may pass through the n+ type of region and the p type of region, and is disposed at the n− type of layer, and a second trench of the second trenches may pass through the n+ type of region, and is disposed in the p type of region.

The semiconductor device may include a gate insulating layer disposed in the first trench, wherein the gate electrode may be disposed on the gate insulating layer.

The gate insulating layer and the gate electrode may expose the second trench and at least some of the n+ type of region disposed around the second trench.

The semiconductor device may further include an insulating layer disposed on the gate electrode, wherein the source electrode may be disposed on the insulating layer and the n+ type of region.

The source electrode may be disposed in the second trench and may contact the n+ type of region disposed around the second trench.

The drain electrode may be disposed on a second surface of the n+ type of silicon carbide substrate.

According to embodiments of the present disclosure, it is possible to increase a channel length of a semiconductor device by lengthening a lateral length of a gate trench in a unit cell. Accordingly, a channel density of the semiconductor device may be improved.

BRIEF DESCRIPTION OF THE DRAWINGS

The embodiments herein may be better understood by referring to the following description in conjunction with the accompanying drawings, briefly described below, in which like reference numerals indicate identically or functionally similar elements.

Figure 1:
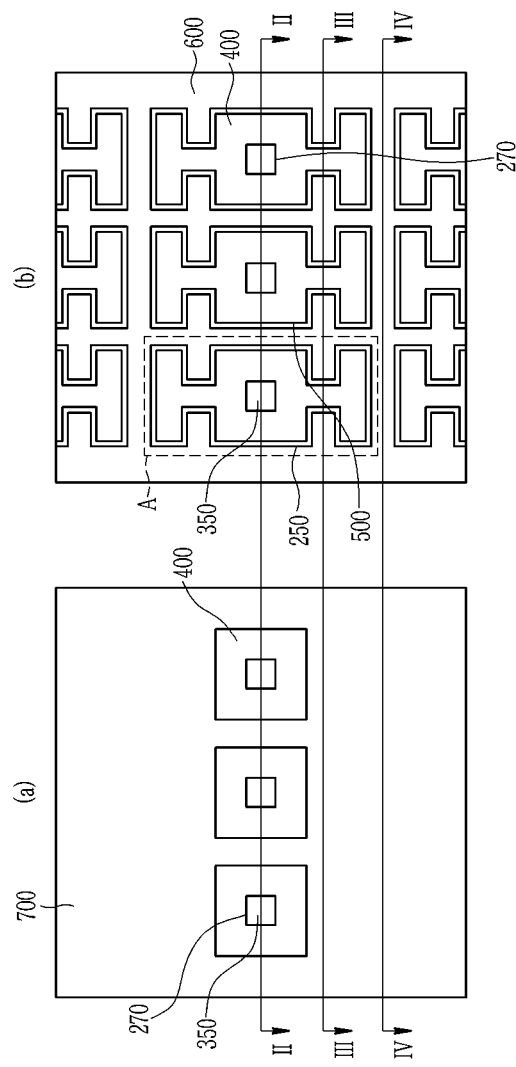
FIG. 1 illustrates an exemplary layout of a semiconductor device according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

The present disclosure will be described more fully hereinafter with reference to the accompanying drawings, in which exemplary embodiments of the disclosure are shown. However, it is to be understood that the disclosure is not limited to the disclosed embodiments, but, on the contrary, is intended to cover various modifications. As those skilled in the art would realize, the described embodiments may be modified in various different ways, all without departing from the spirit or scope of the present disclosure.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Figure 2:
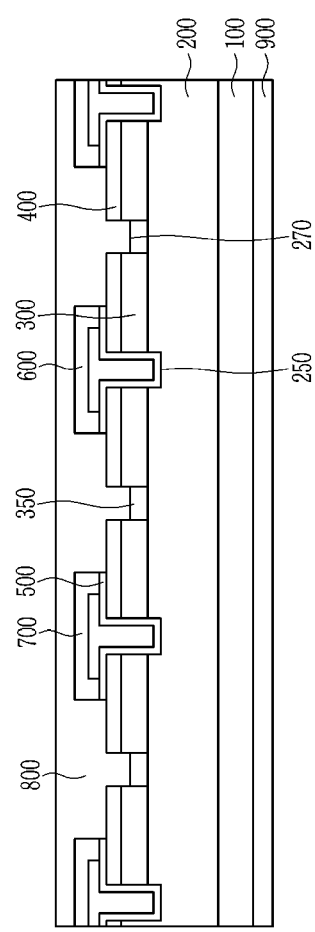
FIG. 2 illustrates an exemplary cross-sectional view taken along line II-II of FIG. 1.
Figure 3:
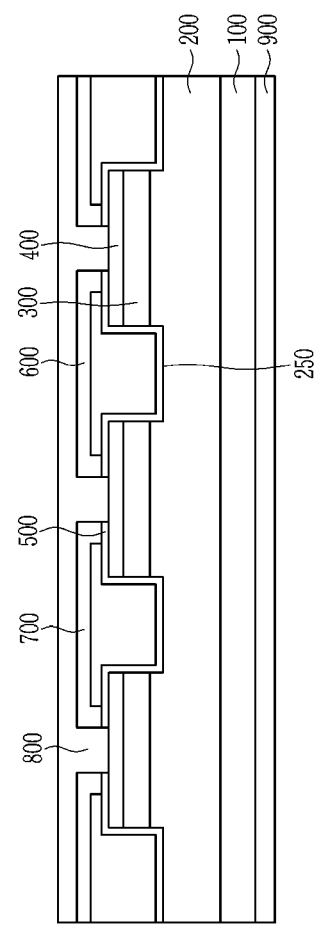
FIG. 3 illustrates an exemplary cross-sectional view taken along line III-III of FIG. 1.
Figure 4:
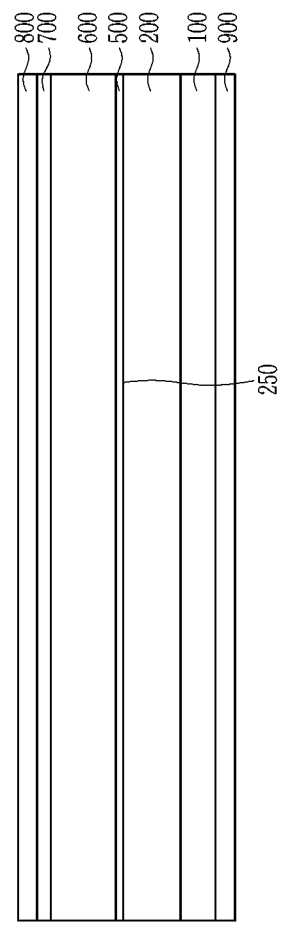
FIG. 4 illustrates an exemplary cross-sectional view taken along line IV-IV of FIG. 1.

Referring now to embodiments of the present disclosure, FIG. 1 illustrates an exemplary layout of a semiconductor device according to embodiments of the present disclosure. FIG. 2 illustrates an exemplary cross-sectional view taken along line II-II of FIG. 1. FIG. 3 illustrates an exemplary cross-sectional view taken along line III-III of FIG. 1. FIG. 4 illustrates an exemplary cross-sectional view taken along line IV-IV of FIG. 1.

As shown in FIG. 1 to FIG. 4, a semiconductor device according to embodiments of the present disclosure includes an n+ type of silicon carbide substrate 100, an n− type of layer 200, a first trench 250, a plurality of second trenches 270, a p type of region 300, a p+ type of region 350, an n+ type of region 400, a gate electrode 600, an insulating layer 700, a source electrode 800, and a drain electrode 900.

Section (a) of FIG. 1 shows a layout of a semiconductor device in which the source electrode 800 is omitted, while section (b) of FIG. 1 shows a layout of a semiconductor device in which the insulating layer 700 and the gate electrode 600 are partially omitted.

In the semiconductor device according to embodiments of the present disclosure, the first trench 250 is disposed with a lattice shape in a plan view, and the gate electrode 600 is disposed in the first trench 250. The plurality of second trenches 270 are disposed with a matrix shape in a plan view, and the p+ type of region 350 is disposed below a lower surface of each second trench 270. The p+ type of region 350 and the source electrode 800 contact each other in the second trench 270. The second trench 270 is spaced apart from the first trench 250.

In addition, the semiconductor device according to embodiments of the present disclosure includes a plurality of unit cells (A). The unit cells (A) are quadrangles in a plan view, and are repeatedly disposed. Each unit cell (A) includes one second trench 270, and the second trench 270 is disposed at a central portion of the unit cell (A) in a plan view.

Hereinafter, a specific structure of the semiconductor device according to embodiments of the present disclosure will be described.

The n− type of layer 200 is disposed on a first surface of the n+ type of silicon carbide substrate, the p type of region 300 is disposed on the n− type of layer 200, and the n+ type of region 400 is disposed on the p type of region 300. The first trench 250 passes through the p type of region 300 and the n+ type of region 400, and is disposed at the n− type of layer 200. The second trench 270 passes through the n+ type of region 400, and is disposed in the p type of region 300. The first trench 250 and second trench 270 are spaced apart from each other. Thus, the n+ type of region 400 is disposed to be close to the lateral surface of the first trench 250 and the lateral surface of the second trench 270. Herein, since the gate electrode 600 is disposed in the first trench 250, the first trench 250 may be defined as a gate trench.

The p+ type of region 350 is disposed below a lower surface of the second trench 270. The p+ type of region 350 may be disposed not only below the lower surface of the second trench 270 but also elsewhere else. For example, the p+ type of region 350 may be disposed to fill the second trench 270. In addition, the p+ type of region 350 may be disposed below the lower surface of the second trench 270 and below a lower surface of the first trench 250, respectively. Further, the p+ type of region 350 may be disposed below the lower surface of the second trench 270, and may be disposed to be close to a lateral surface of the second trench 270.

A gate insulating layer 500 is disposed in the first trench 250. The gate electrode 600 is disposed on the gate insulating layer 500. The gate electrode 600 may include a metal or a poly-crystalline silicon. The gate electrode 600 is disposed to fill the first trench 250.

The gate insulating layer 500 and the gate electrode 600 are not disposed in and around the second trench 270. That is, the gate insulating layer 500 and the gate electrode 600 expose the second trench 270 and the n+ type of region 400 disposed around the second trench 270.

The insulating layer 700 is disposed on the gate electrode 600. The insulating layer 700 covers a lateral surface of the gate electrode 600 around the second trench 270 and between the second trenches 270.

The source electrode 800 is disposed in the insulating layer 700, the n+ type of region 400, and the second trench 270. The source electrode 800 contacts the n+ type of region 400 around the second trench 270, and contacts the p+ type of region 350 in the second trench 270. The drain electrode 900 is disposed on the second surface of the n+ type of silicon carbide substrate 100. The source electrode 800 and the drain electrode 900 may include an ohmic metal. Herein, the second surface of the n+ type of silicon carbide substrate 100 is disposed at an opposite side of the first surface of the n+ type of silicon carbide substrate.

A channel of the semiconductor device of embodiments of the present disclosure is formed in the p type of region 300 disposed to be adjacent to the lateral surface of the first trench 250.

Hereinafter, the unit cell (A) of the semiconductor device according to embodiments of the present disclosure will be described with reference to FIG. 5.

Figure 5:
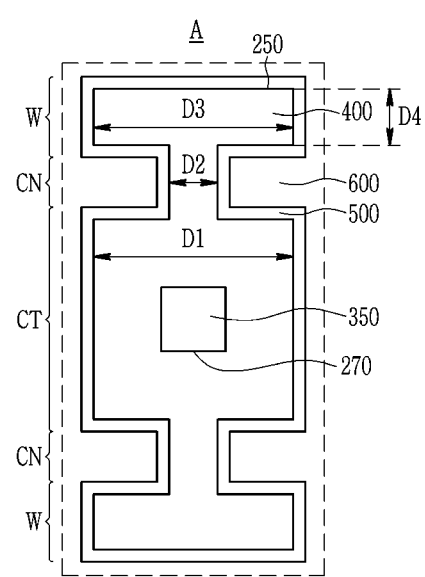
FIG. 5 illustrates an exemplary layout of a unit cell (A) of the semiconductor device of FIG. 1.

FIG. 5 illustrates an exemplary layout of a unit cell (A) of the semiconductor device of FIG. 1. FIG. 5 is an enlarged view of the unit cell (A) of the semiconductor device shown in FIG. 1, in which the source electrode 800, the insulating layer 700, and the gate electrode 600 as shown in FIG. 1 are omitted.

As shown in FIG. 5, the unit cell (A) of the semiconductor device according to embodiments of the present disclosure is a quadrangle in a plan view. The unit cell (A) include one second trench 270 and the p+ type of region 350 disposed below the lower surface of the second trench 270 (refer to FIG. 2). The second trench 270 is disposed at a central portion of each unit cell (A) in a plan view. The p+ type of region 350 contacts the source electrode 800 (refer to FIG. 2).

In addition, the unit cell (A) includes the n+ type of region 400 disposed around the second trench 270 in a plan view and the first trench 250 adjacent to the n+ type of region 400 in a plan view. Further, the unit cell (A) includes the gate insulating layer 500 and the gate electrode 600 disposed in the first trench 250.

The unit cell (A) includes a contact portion (CT), an outer portion (W), and a connection portion (CN). The contact portion (CT) which is a region in which the source electrode 800 and the p+ type of region 350 contact each other includes the second trench 270 and the p+ type of region 350. The outer portion (W) is respectively disposed at upper and lower portions of the contact portion (CT) in a plan view, and the connection portion (CN) connects the outer portion (W) and the contact portion (CT).

A width D1 between the first trenches 250 horizontally adjacent in a plan view in the contact portion (CT) may be the same as a width D3 between the first trenches 250 horizontally adjacent in a plan view in the outer portion (W). In addition, a width D2 between the left and right first trenches 250 in a plan view in the connection portion (CN) may be shorter than the width D1 between the left and right first trenches 250 in a plan view in the contact portion (CT). That is, the width between the first trenches 250 of the direction of the outer portion (W) in the contact portion (CT) in a plan view is bent once.

As described above, the channel of the semiconductor device of embodiments of the present disclosure is formed in the p type of region 300 adjacent to the lateral surface of the first trench 250, and in the unit cell (A), since the width between the first trenches 250 adjacent in the direction of the outer portion (W) in the contact portion (CT) in a plan view is not constant and is bent once, a length of the lateral surface of the first trench 250 becomes long. Thus, the length of the channel of the semiconductor device becomes long. Therefore, the channel density of the semiconductor device may be improved.

According to embodiments of the present disclosure, the width between the first trenches 250 adjacent in the direction of the outer portion (W) in the contact portion (CT) in a plan view is bent once, but is not limited thereto, and it may be bent several times.

In addition, in the outer portion (W) of the unit cell (A), the source electrode 800 and the p+ type of region 350 do not contact. Accordingly, it is possible to decrease the width between the first trenches 250 adjacent in the outer portion (W). That is, it is possible to decrease a width D4 between the first trenches 250 vertically adjacent in the outer portion (W). Generally, as a width between adjacent trench gates decreases, the channel density of the semiconductor device increases, and thus, since it is possible to decrease the width D4 between the upper and lower first trenches 250 in a plan view in the outer portion (W) of the unit cell (A) in the semiconductor device according to embodiments of the present disclosure, the channel density of the semiconductor device may be improved.

Hereinafter, a channel density of a conventional semiconductor device and the channel density of the semiconductor device according to embodiments of the present disclosure will be compared and described with reference to FIG. 6.

Generally, a channel density of a semiconductor device is defined as a channel length per unit area of a planar unit cell.

Figure 6:
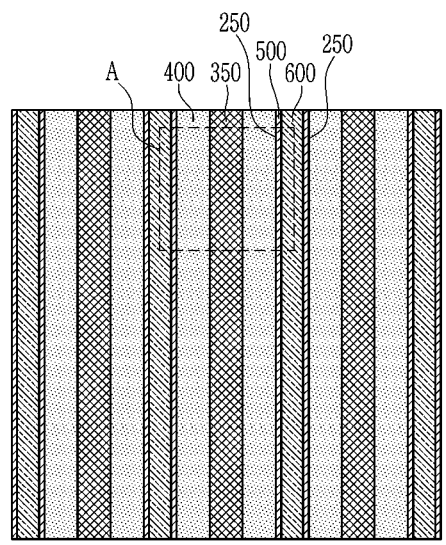
FIG. 6 illustrates an exemplary layout of a conventional semiconductor device.

FIG. 6 illustrates an exemplary layout of a conventional semiconductor device.

As shown in FIG. 6, in the conventional semiconductor device which is a trench gate MOSFET, the n+ type of region 400, the p+ type of region 350, and a gate trench 250 are disposed in a plan view. The gate insulating layer 500 and the gate electrode 600 are disposed in the gate trench 250. The channel of the semiconductor device is disposed at a lateral surface of the gate trench 250.

Comparing the channel density of the typical semiconductor device (shown in FIG. 6) and the channel density of the semiconductor device according to embodiments of the present disclosure (shown in FIG. 1) in a state in which areas of the unit cells (A) thereof are the same, since the width between the first trenches 250 of the direction of the outer portion (W) is not constant and is bent once in the contact portion (CT) of the unit cell (A) of the semiconductor device according to the present exemplary embodiment, the length of the lateral surface of the first trench 250 becomes long (refer to FIG. 5), and thus, the channel length of the semiconductor device according to embodiments of the present disclosure is longer than that of the typical semiconductor device.

In the trench gate MOSFET, the channel density is proportional to a forward direction current density. That is, an increase of the channel density means an increase of the forward direction current density. Thus, since the current density of the semiconductor device disclosed herein increases according to the increase of the channel density, when compared to the conventional semiconductor device, it is possible to reduce an area of a semiconductor device for obtaining the same current amount. Therefore, it is possible to reduce a manufacturing cost of a semiconductor device and to improve a yield thereof.

While this disclosure has been described in connection with certain embodiments, it is to be understood that the disclosure is not limited to the disclosed embodiments, but, on the contrary, is intended to cover various modifications and equivalent arrangements included within the spirit and scope of the appended claims.

DESCRIPTION OF SYMBOLS

| | |
|---|---|
| 100: n+ type of silicon carbide substrate | 200: n− type of layer |
| 250: first trench | 270: second trench |
| 300: p type of region | 350: p+ type of region |
| 400: n+ type of region | 500: gate insulating layer |
| 600: gate electrode | 700: insulating layer |
| 800: source electrode | 900: drain electrode |

What is claimed is:
1. A semiconductor device comprising:
an n+ type silicon carbide substrate;
an n− type layer;
a p type region;
a p+ type region;

an n+ type region;

a gate electrode;

a source electrode;

a drain electrode; and a plurality of unit cells, wherein each unit cell of the plurality of unit cells includes:

a contact portion at which the source electrode and the p+ type region
contact each other, a first outer portion disposed on a first side of the contact portion in a plan view, a second outer portion disposed on a second side of the contact portion, opposite the first side of the contact portion in the plan view; and a first connection portion connecting the first outer portion and the contact portion, and a second connection portion connecting the contact portion and the second outer portion, a width of the contact portion measured between a first trench and a second trench horizontally adjacent in the plan view is equal to a width of each of the first outer portion and the second outer portion measured between the first trench and the second trench horizontally adjacent in the plan view, and a width of each of the first connection portion and the second connection portion measured between the first trench and the second trench horizontally adjacent in the plan view is less than the width of the contact portion measured between the first trench and the second trench horizontally adjacent in the plan view.

2. The semiconductor device of claim 1, wherein
each unit cell of the plurality of unit cells includes:
the first trench, the second trench, and a third trench adjacent to each of the first and second outer portions have a lattice shape in the plan view.

3. The semiconductor device of claim 2, wherein each unit cell of the plurality of unit cells includes:
a fourth trench spaced apart from the first, second and third trenches.

4. The semiconductor device of claim 3, wherein the plurality of unit cells including:
the fourth trenches having a matrix shape in the plan view.

5. The semiconductor device of claim 4, wherein
each unit cell of the plurality of unit cells includes the fourth trench which is disposed at a central portion of each unit cell.

6. The semiconductor device of claim 5, wherein the fourth trench of each unit cell of the plurality of unit cells is disposed at the contact portion, and
the p+ type region is disposed below a lower surface of the fourth trench of each unit cell of the plurality of unit cells.

7. The semiconductor device of claim 4, wherein the n− type layer is disposed on a first surface of the n+ type of silicon carbide substrate,
the p type region is disposed on the n− type layer, and
the n+ type region is disposed on the p type region.

8. The semiconductor device of claim 7, wherein the first trench of each unit cell of the plurality of unit cells passes through the n+ type region and the p type region, and is disposed at the n− type layer, and
the fourth trench of each unit cell of the plurality of unit cells passes through the n+ type region, and is disposed on the p+ type region.

9. The semiconductor device of claim 8, further comprising a gate insulating layer disposed in each of the first and second trenches of each unit cell of the plurality of unit cells,
wherein the gate electrode is disposed on the gate insulating layer.

10. The semiconductor device of claim 9, wherein
the gate insulating layer and the gate electrode expose the fourth trench of each unit cell of the plurality of unit cells and at least some of the n+ type region disposed around the fourth trench of each unit cell of the plurality of unit cells.

11. The semiconductor device of claim 10, further comprising
an insulating layer disposed on the gate electrode,
wherein the source electrode is disposed on the insulating layer and the n+ type region.

12. The semiconductor device of claim 10, wherein
the source electrode is disposed in the fourth trench of each unit cell of the plurality of unit cells and contacts the n+ type region disposed around the fourth trench of each unit cell of the plurality of unit cells.

13. The semiconductor device of claim 12, wherein
the drain electrode is disposed on a second surface of the n+ type silicon carbide substrate.

* * * * *